(12) United States Patent
Sato et al.

(10) Patent No.: US 6,515,295 B1
(45) Date of Patent: Feb. 4, 2003

(54) DEVICE FOR EXPOSURE OF THE PERIPHERAL AREA OF A FILM CIRCUIT BOARD

(75) Inventors: Masanori Sato, Yokohama (JP); Satoshi Murakami, Yamato (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/886,005

(22) Filed: Jun. 22, 2001

(30) Foreign Application Priority Data

Jun. 22, 2000 (JP) ........................................ 2000-187646

(51) Int. Cl.[7] .............................................. G01N 21/86
(52) U.S. Cl. .............................. 250/559.36; 250/559.34
(58) Field of Search ........................ 250/559.36, 559.4, 250/559.45, 559.44, 559.22, 559.34, 221; 356/237.4, 237.5, 239.3

(56) References Cited

U.S. PATENT DOCUMENTS 4,549,206 A * 10/1985 Suzuki et al. .......... 250/559.34
4,899,195 A    2/1990 Gotoh

FOREIGN PATENT DOCUMENTS

JP          3-78237       4/1991

* cited by examiner

*Primary Examiner*—Que T. Le
(74) *Attorney, Agent, or Firm*—Nixon Peabody LLP; David S. Safran

(57) ABSTRACT

A device for exposure of the peripheral area of a film circuit board in which the edge of the copper foil can be exactly determined and the position of the irradiation area can be controlled with high precision is obtained in that a resist (R) in the peripheral area of a conductive foil located on a film circuit board (TP) is irradiated with exposure light and is thus exposed, while the film circuit board (TP) in which there are perforation holes (PH) with a stipulated pitch to one another, is transported, in that an optical detector (4) is used as the sensor for determining the edge part of the conductive foil, in that the sensor light emitted onto the edge part of the conductive foil is received by a light receiving part (4b), in that the optical detector (4b) is subjected to motion control in the direction which orthogonally intersects the transport direction, such that the amount of light reception is constant and in that the area irradiated with the exposure light is moved by the same amount as the optical detector (4), and thus, the peripheral area is exposed. The length of the sensor light in the transport direction of the irradiation area on the film circuit board TP is determined by the pitch between the perforation holes multiplied by a natural number. In this way, the resist (R) of the peripheral area of the conductive foil can be exposed according to the edge position of the conductive foil.

3 Claims, 7 Drawing Sheets

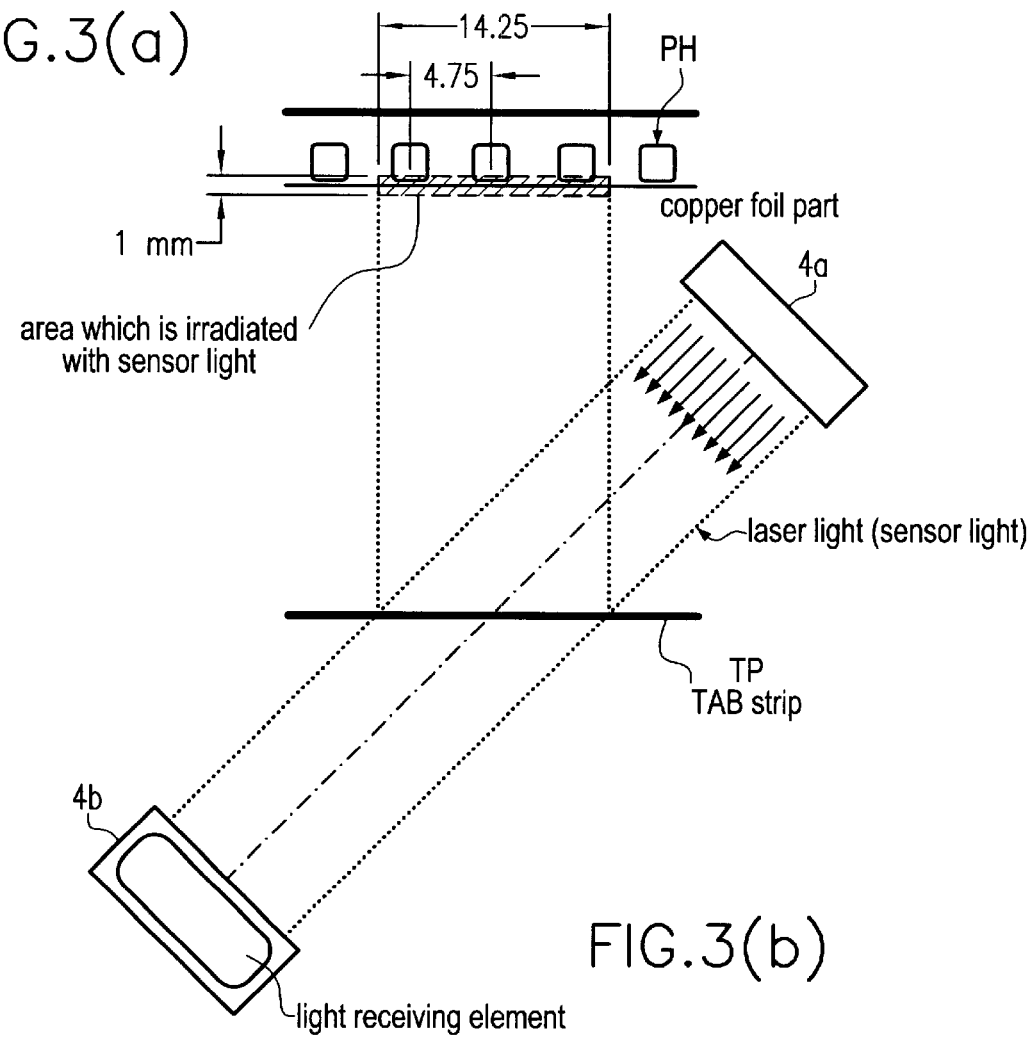
FIG.3(a)
FIG.3(b)
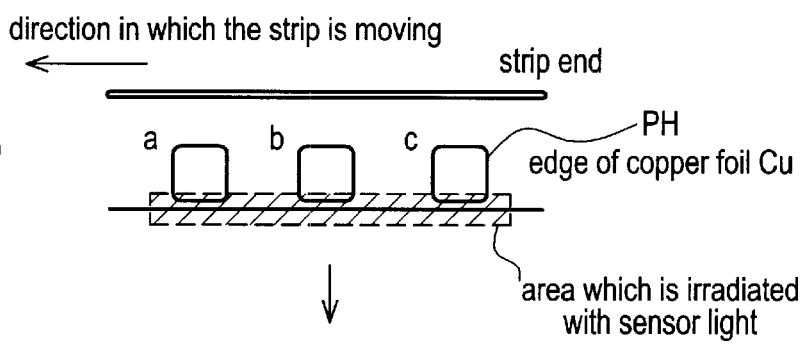
FIG.4(a)
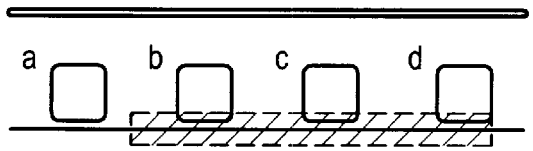
FIG.4(b)

DEVICE FOR EXPOSURE OF THE PERIPHERAL AREA OF A FILM CIRCUIT BOARD

BACKGROUND OF THE INVENTION

1. Field of the Invention

The invention relates to a device for exposure of a peripheral area of a film circuit board provided with perforation holes, such as a TAB strip, by which unnecessary resist is exposed.

2. Description of Related Art

In a liquid crystal substrate, a portable phone, a camera, a pocket calculator, an IC card, or the like, a film circuit board is used in which an integrated circuit is deposited to an insulating film, such as a polyester film, a polyimide film or the like, with a thickness of roughly 25 to 125 microns.

FIG. 8(a) shows part of a TAB strip as one of the film circuit boards. The TAB strip TP is a strip workpiece, for example, with a width of 35 mm to 70 mm and a length of a few hundred meters, which is ordinarily wound onto a spool.

The circuit is produced on the TAB strip TP by a conductive foil (for example, a copper foil) being cemented to the above described insulating film and by the following processes and the like being repeated:

deposition process of the resist projection printing process of the desired circuit pattern development process of the resist etching process in which the unnecessary conductive foil is removed. In the respective process, the film circuit board is unwound from the spool, is treated and processed, and wound back onto a spool.

The TAB strip (TP) (hereinafter also called the strip) is provided on both sides with perforation holes (PH) (also called sprocket holes) which are located at the same distance to one another (for example, with a pitch of 4.75 mm) and which are used for positioning and transport of the strip in the above described process. The strip TP is transported, for example, by rotating rollers with projections which fit into the perforation holes PH. Furthermore, in treatments such as exposure and the like, the strip TP is positioned such that the pins which are located at given positions of the device are inserted into the perforation holes PH.

As was described above, in the etching process, an unnecessary conductive foil (hereinafter also called copper (Cu) foil) is removed. When the conductive foil is not sufficiently removed, there are cases in which insulation faults and the like, and thus scrap, result. Furthermore, there is the disadvantage that the appearance is poor.

FIG. 8(b) shows a state in which a resist R has been deposited to the copper foil of the TAB strip TP. FIG. 8(b) is a cross section relative to the strip as shown in FIG. 8(a). The area shown by the double dot-dash line designates the resist R.

As was described above, the copper foil was cemented to the insulating film. On the edge of the copper foil (hereinafter also called the peripheral area), the deposited resist R protrudes as a result of the surface tension, by which the edge is thicker than the remaining area.

Conventionally, a circuit pattern is formed such a peripheral area of the copper foil is not used. The area (the area which is cross-hatched) in which a circuit pattern is formed is shown in FIG. 8(a) as the "effective pattern area".

Conventionally, the peripheral area of the copper foil is removed in the etching process. However, since the resist R in the peripheral area of the copper foil is thick, as was described above, a greater amount of exposure is needed than in the remaining area (in the area in which the pattern is formed) in order to expose completely. With one-time exposure (exposure when the pattern is being formed), the amount of exposure is inadequate, as a result of which, in the development in the peripheral area, unexposed resist remains, and in the etching process, the copper foil is not eliminated. This unnecessarily remaining copper foil is ultimately unnecessary for attachment of the element. Thus, cutting off or the like must be performed with a cutting tool.

In order to completely expose the unnecessary resist in the peripheral area of the copper foil, it is therefore necessary to repeatedly expose only the resist in the peripheral area of the copper foil using an exposure device.

On the other hand, a process for exposing the peripheral area of a TAB strip in which only the resist in the peripheral area of the copper foil is exposed was proposed in Japanese patent disclosure document HEI 3-78237. In this publication, using FIG. 1, a process for exposure of a peripheral area is described in which UV (ultraviolet) radiation is emitted from a light source lamp through an optical fiber onto the two edges of the film and is focused by means of an exit optics unit, and in which the resist in the peripheral area of a moving film is exposed. In this process, the TAB strip is transported by a film transport device which has a friction roller and a sprocket roller. Since the TAB strip is made of a thin resin, as was described above, a serpentine is often formed during transport. The above described sprocket roller has protrusions which engage with the perforation holes of the film substrate. This prevents the film from slipping or twisting during transport.

As was described above, for the TAB strip, a copper foil is cemented to the film. But it is difficult to cement the copper foil to the film with high precision. The copper foil undulates with respect to the film roughly ±0.3 mm.

FIG. 9 schematically shows the above described snaking of the copper foil. FIG. 9 shows in zone (b) the case in which the copper foil is located on the position (standard position) to be cemented. FIG. 9 shows in zone (a) a case in which the copper foil is located towards the outside of the strip TP. Zone (c) of FIG. 9 shows a case in which the copper foil is located towards the inside of the strip TP relative to the standard position.

Also in the case of transport of a TAB strip TP by the sprocket roller, between the two, an amount of play of roughly 0.1 mm is required to prevent the perforation holes from colliding with the protrusions of the sprocket roller, thus being abraded and damaged. There are therefore cases in which in the TAB strip TP, a wiggle of roughly ±0.1 mm is formed during transport. The peripheral area of the copper foil with a maximum width of roughly ±0.4 mm meanders during transport through the snaking of the copper foil with respect to the TAB strip TP and through the snaking of the TAB strip TP on itself during transport.

It depends on the user who produces the film circuit boards. The region which is to be subjected to exposure of the peripheral area extends, however, from the edge of the copper foil by a width of roughly 0.3 mm (hereinafter this width is called the exposure width). The exposure width should have few faults. But the following problems must be considered:

(1) When the exposure width is less than or equal to 0.2 mm from the edge of the copper foil, it is smaller than the projecting area of the resist R, as a result of which, during development, unexposed resist remains. Therefore, an exposure width of greater than or equal to 0.2 mm is needed.

(2) The area in which the pattern is formed is fixed independently of the snaking of the copper foil as a result of the perforation holes (PH) (for example, by 1 mm to the inside from the edges of the perforation holes as shown in FIG. 9). When the copper foil is located towards the inside of the strip TP, as is shown in zone (c) of FIG. 9, the distance between the edge of the copper foil and the area in which the pattern is formed is therefore only roughly 0.4 mm. At an exposure width at least equal to 0.4 mm, the exposure light enters the area for forming the pattern and exposes the resist R which is necessary for pattern formation, resulting in possible formation of scrap.

(3) Based on (1) and (2), an exposure width of 0.3 mm±0.1 mm must be ensured for exposure of the peripheral area.

U.S. Pat. No. 4,899,195 suggests a technology of exposure of a peripheral area in which exposure takes place from the edge of the workpiece with a stipulated width. Here, it is described that, using an optical detector having an emission element and a light receiving element, the position of the edge of the workpiece (wafer) is determined by changing the intensity of the light received by the light receiving element, and that, as a result of this determination signal, the irradiation position of the light for exposure of the peripheral area is controlled.

When the optical detector described in U.S. Pat. No. 4,899,195 is used to determine the edge of the copper foil Cu of the TAB strip TP, the following problem arises.

As is shown in FIG. 9, the film in the vicinity of the copper foil of the TAB strip TP is provided with perforation holes PH. The sensor light from the projection element (emission element) of the optical detector is projected onto the edge area of the copper foil (to the region in which the perforation holes PH are located). During transport of the TAB strip TP, the light receiving element receives the light transmitted by the film once and the light which has passed through the perforation holes PH once.

The light transmitted by the film is attenuated, by which the light intensity is reduced (the transmittance at a sensor light wavelength of 670 nm (nonexposure light) is roughly 20%). On the other hand, the light which had passed through the perforation holes PH is not attenuated. Here, the intensity of the light received by the light receiving element fluctuates greatly accordingly to the transport of the TAB strip TP.

Since, when the edge is determined by the optical detector in the above described U.S. Patent, the edge position is determined by the change of the intensity of the light received by the light receiving element, it cannot be distinguished whether the change of the light intensity was caused by the presence or absence of perforation holes PH or whether it was caused by the change of the edge position of the copper foil when the presence or absence of the perforation holes PH changes the intensity of the light received by the light receiving element, as was described above. Therefore, the edge position of the copper foil cannot be determined.

SUMMARY OF THE INVENTION

The invention was devised to eliminate the above described defects in the prior art. Thus, a primary object of the present invention is to devise a device for exposure of the peripheral area of a film circuit board in which the point onto which the sensor light is projected is provided with perforation holes, in which the edge of the copper foil can be exactly determined, even if the light receiving element receives the attenuated light transmitted by the film and the unattenuated light which has passed through the perforation holes, and in which the position of the irradiation area can be controlled with high precision.

In a device for exposure of the peripheral area of a film circuit board in which a film circuit board, which has perforation holes with a stipulated pitch, is transported in a certain direction, and moreover, a resist in the peripheral area of a conductive foil located in the above described film circuit board is irradiated with exposure light from a light irradiation means which has a stipulated irradiation area and in which, thus, the resist is exposed in the above described peripheral area, the above object is achieved in accordance with the invention in that an edge determination means for determining the edge area of the conductive foil located in the film circuit board is an optical detector which has a projection part and a light receiving part, that the length (irradiation length) of the sensor light which has been emitted onto the film circuit board and which has been projected by the projection part is determined in the transport direction of the film circuit board by the "pitch between the perforation holes multiplied by a natural number", furthermore, that the sensor light emitted onto the edge area of the conductive foil of the film circuit board is received by the above described light receiving part, that the above described edge determination means is subjected to motion control by a motion control means such that the amount of light reception of the above described light receiving part becomes constant, and that the area irradiated with the above described exposure light is moved in the same direction as the direction of motion of the above described edge determination means and by the same amount as the amount of motion the latter.

Since, according to the invention, the (radiation) length of the sensor light which is projected by the projection part of the optical detector and which is emitted onto the film circuit board is determined in the transport direction of the film circuit board by the "pitch between the perforation holes multiplied by a natural number", as was described above, the total amount of light received by the light reception element (the light which has passed through the perforation holes and the light transmitted by the film) does not change, regardless of the motion of the perforations according to the transport of the film circuit board. Therefore, if control is exercised in such a way that the total amount of sensor light received by the light receiving part becomes constant, regardless of the meander of the copper foil with respect to the TAB strip and regardless of the snaking of the TAB strip in itself, the resist in the peripheral area of the film circuit board can be exposed with high precision.

Furthermore, by tilting the projection parts and the light receiving part of the optical detector with respect to the film circuit board or by changing the shape of the light exit part of the projection part, the length of the sensor light in the transport direction of the film circuit board can be changed. Thus, an application can be found for exposure of the peripheral area of a film circuit board with different pitches between the perforation holes. If especially by tilting the projection part and the light receiving part of the optical detector with respect to the film circuit board, the angle thereof can be adjusted, the length of the sensor light in the transport direction of the film circuit board can be easily adjusted only by adjusting the inclination of the projection part and the light receiving part of the optical detector.

Furthermore, the area irradiated with exposure light can be moved by movement of the position of a projection lens unit which focuses the exposure light or by the movement of a mask which is located on the exit end of the exposure light.

In particular, by moving the mask, it is unnecessary to move the projection lens unit. In this way, it is possible to prevent the motion control means from becoming large even if the projection lens unit becomes large and will be heavier.

Furthermore, for example, by using a parallel light linear sensor, the amount of light reception can be made more constant by means of a semiconductor laser as the optical detector when the perforation holes are moved by the transport of the film circuit board.

Since the light from a parallel light linear sensor is laser light and propagates in a straight line, the light transmitted through the film and the light which has passed through the perforation holes can be exactly recorded.

In the following, the invention is further described using several embodiments shown in the drawings.

BRIEF DESCRIPTION OF THE DRAWINGS

FIGS. 3(a) & 3(b) each schematically depict the process for adjusting the optical detector;

FIGS. 4 (a) & 4(b) each schematically depict the sensor light which is received by the optical detector when a TAB strip is in motion;

DETAILED DESCRIPTION OF THE PREFERRED EMBODIMENTS

Figure 1:
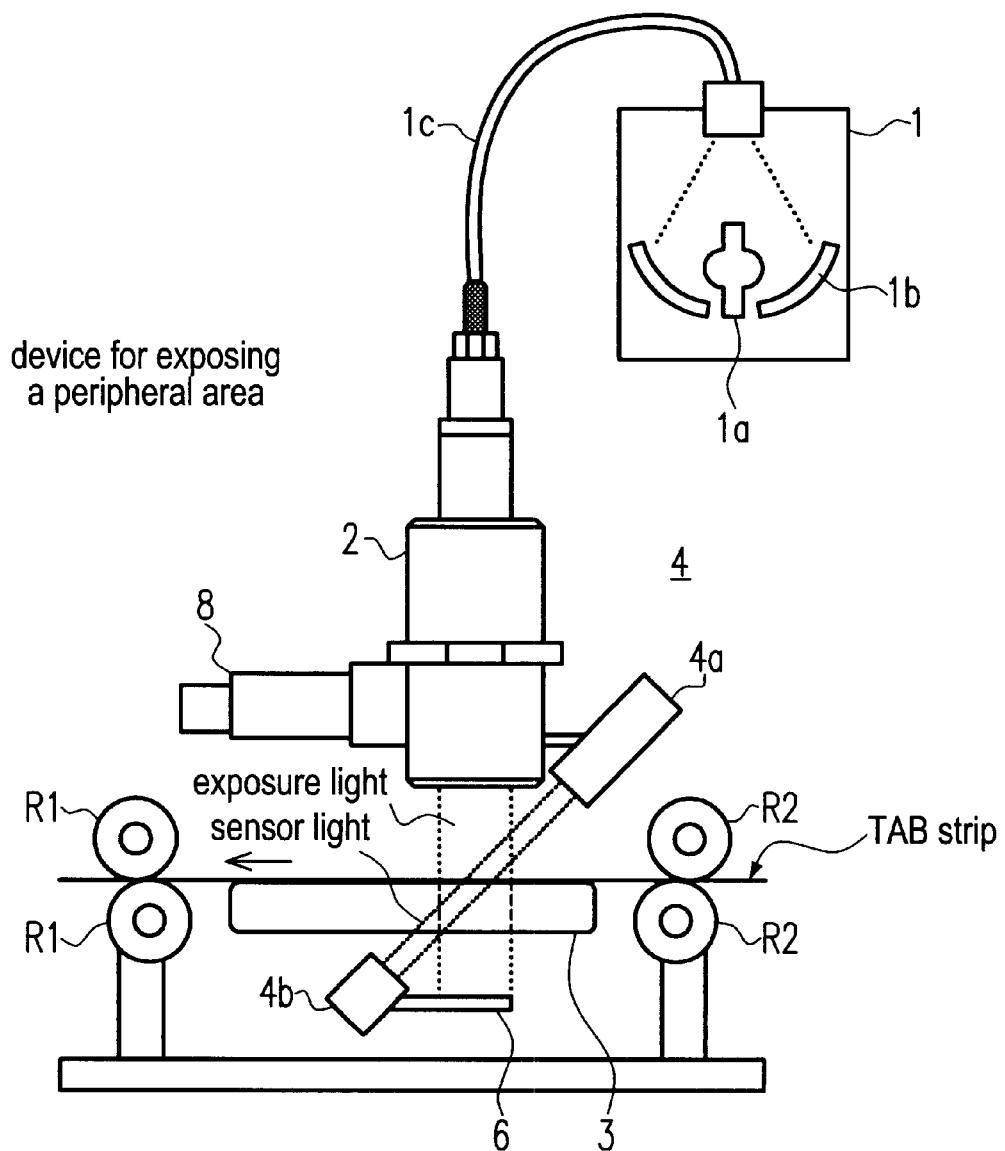
FIG. 1 is a schematic depiction of the arrangement of a device for exposing the peripheral area of a film circuit board according to a first embodiment of the invention.

FIGS. 1 & 2 schematically show the arrangement of a first embodiment of the device in accordance with the invention for exposure of a peripheral area. In FIG. 1, the device for exposing the peripheral area, in this embodiment, is viewed from the direction which orthogonally intersects the transport direction of a film circuit board. In FIG. 2, this device is viewed from the transport direction of the film circuit board. The device for exposure of the peripheral area, in this embodiment, is located upstream of the device for developing the TAB strip (in one step prior to development) at two points per strip, i.e., on both sides in one strip. The film circuit board TP (hereinafter called the TAB strip), according to the development speed, is transported continuously at 1.0 to 3.0 m/minute. During this transport, a resist is exposed in the peripheral area of the copper foil.

In FIGS. 1 & 2, the TAB strip TP is transported by feed rollers R1 and R2 on a carrier 3, for example, in the direction of the arrow shown in FIG. 1. The carrier 3 is arranged to prevent the TAB strip TP from moving during transport in the direction of the optical axis of the peripheral area exposure light (to the top and bottom in the drawings). It does not have a special device for holding the TAB strip securely.

The exposure light (UV radiation) for exposing the resist on the TAB strip TP is routed into a projection lens unit 2 from a light source part 1 which has a lamp 1a and an ellipsoidal mirror 1b by means of a quartz optical fiber 1c; the lens unit focuses UV radiation on the peripheral area of the copper foil of the TAB strip TP on the carrier 3. The edge of the copper foil which has been cemented to the TAB strip TP is determined using an optical detector 4 which has a projection part 4a and a light receiving part 4b.

The optical detector 4 can be, for example, a parallel light linear sensor with a semiconductor laser. The sensor light (nonexposure light) emitted by the projection part 4a of the parallel light linear sensor is laser light and propagates in a straight line. For projection perpendicular to the flat body, the light assumes the shape of a rectangle. The light receiving part 4b can fully absorb the light from the projection part 4a at a given distance and furthermore can determine the change of the amount of light reception.

Figure 2A:
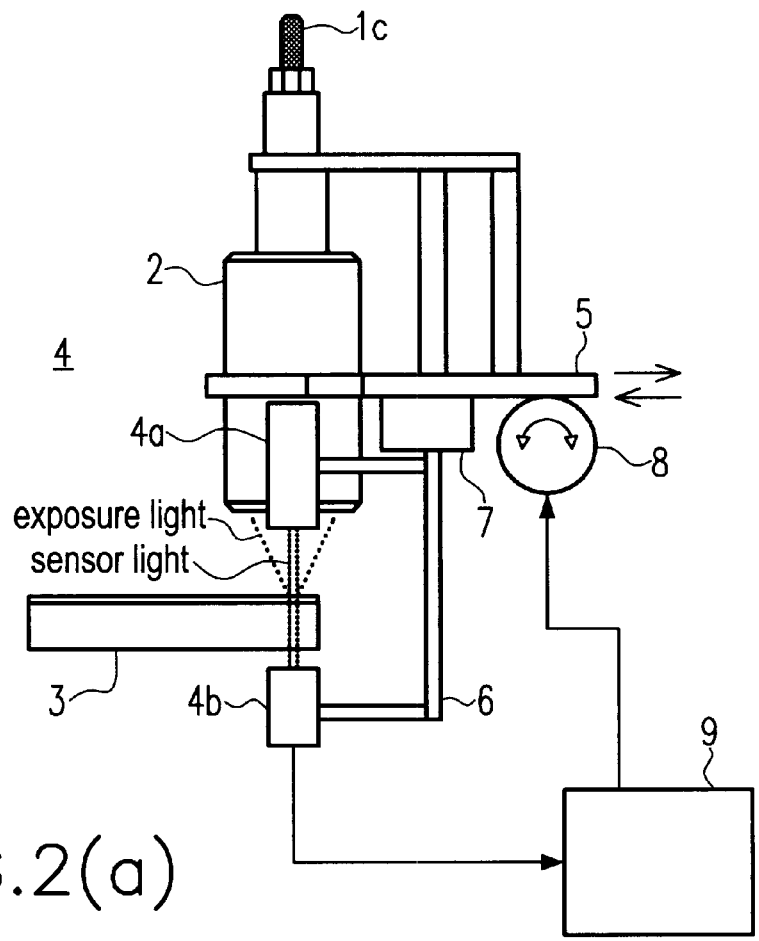
FIGS. 2(a) & 2(b) each schematically depict the arrangement of a device for exposing the peripheral area according to the first embodiment of the invention.

The projection part 4a and the light receiving part 4b of the optical detector 4 are installed in a component 6 for installation of the optical detector which is installed in a sliding base 5 via a device 7 described below for adjusting the relative positions of the sensor light and the exposure light (hereinafter called simply the device for adjustment of relative positions); the sliding base is driven by means of a drive motor 8 in the directions of the arrows in FIG. 2(a) (in the direction which orthogonally intersects the transport direction of the TAB strip TP). The above described projection lens unit 2 is installed in the sliding base 5. When the sliding base 5 is moved by the drive motor 8 in the direction of the arrows in FIG. 2, the projection lens unit 2 and the optical detector 4 move accordingly also in the same direction.

Figure 2B:
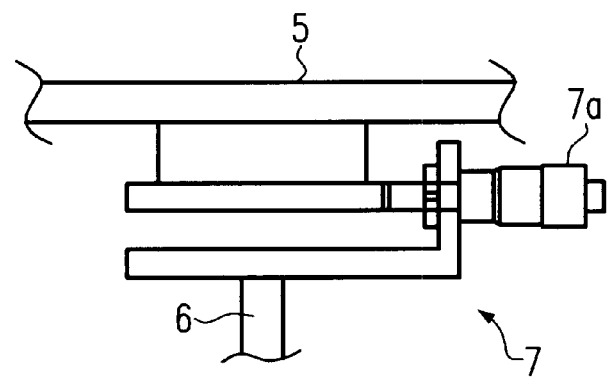

The device 7 for adjustment of relative positions is a device which adjusts the relative positions of the sensor light and the exposure light. As is shown in FIG. 2(b), the device 7 for adjustment of relative positions has a micrometer 8a by which the relative positions of the sliding base 5 and of the component 6 for installation of the optical detector can be adjusted. Since the projection lens unit 2 is installed in the sliding base 5 and the optical detector 4 is installed in the component 6 for installing the optical detector, as was described above, by adjusting the micrometer 7a the relative positions between the irradiation position of the exposure light emitted by the projection lens unit 2 and the sensor light emitted by the projection part 4a of the optical sensor 4 can be adjusted.

In FIG. 2, the reference number 9 labels a control element to which a signal is input with a magnitude which corresponds to the intensity of the light received by the light receiving part 4b of the optical detector 4 (amount of light reception). The control element 9 drives the drive motor 8, thus moving the sliding base 5 and the optical sensor 4 such that the above described amount of light reception becomes always constant. Since an exit part (containing the projection lens) is installed in the sliding base 5 and comprises the projection lens unit 2, from which the peripheral area exposure light emerges, the position of the irradiation area of the exposure light emitted by the above described exit part is changed by the sliding base 5 moving. This means that the optical detector 4 moves such that the amount of light reception becomes always constant. The projection lens unit 2 from which the exposure light emerges, i.e., the exposure light irradiation area, moves to the same degree and in the same direction as the amount of motion of the sensor and the direction of motion thereof in the direction which orthogonally intersects the transport direction of the strip TP.

FIGS. 3(*a*) & 3(*b*) show a process for adjusting the optical detector 4. The sensor light from the projection part 4*a* of the optical detector 4 is emitted with respect to the TAB strip TP from an oblique direction, as is shown in FIG. 3(*b*). The reason for this is to be able to adjust the length of the sensor light irradiating the TAB strip TP in the transport direction, as is described below. By adjusting the angle of incidence of the sensor light of the optical detector 4 into the TAB strip TP, the length of the sensor light emitted onto the TAB strip TP in the transport direction of the TAB strip can be adjusted.

FIG. 3(*a*) shows the state in which the sensor light is emitted onto the TAB strip TP. The cross-hatched area represents the area irradiated with sensor light.

In this embodiment, the length of the sensor light with respect to the strip transport direction is determined by the "pitch" (for example, 4.75 mm) between the perforation holes PH of the TAB strip TP multiplied by a natural number" (for example, this length is determined to be 14.25 mm when the natural number is 3).

FIG. 4 shows the sensor light which is received by the optical detector when the TAB strip moves in the case in which the length of the sensor light is adjusted in the above described manner. The cross-hatched area in the drawing represents the area irradiated with the sensor light. The sensor light in the area which is not shielded by the copper foil Cu is received by the light receiving part 4*b* of the optical detector 4. The light receiving part 4*b* of the optical detector 4 receives both the light which has been attenuated by the film area of the TAB strip TP and the light which has passed through the perforation holes PH.

If the length of the sensor light with respect to the strip transport direction is determined by the "pitch between the perforation holes PH of the TAB strip TP multiplied by a natural number," the intensity of the sensor light which is received by the light receiving part 4*b* of the optical detector 4 and which has passed through the perforation holes PH does not change, even if the TAB strip TP is transported in the manner from FIG. 4(*a*) to FIG. 4(*b*). This is because the area occupied by the perforation holes PH in the region which is irradiated with sensor light is always constant even when the TAB strip TP is being transported.

When the position of the copper foil edge in the direction orthogonal to the transport direction of the TAB strip does not change, the total amount of light received by the light receiving part 4*b* becomes constant even if during transport of the TAB strip the sensor light passes through the perforation holes PH. When the position of the optical sensor 4 regardless of the snaking of the copper foil with respect to the TAB strip and regardless of the meandering of the TAB strip, in itself, is controlled such that the total amount of light received by the light receiving part 4*b* becomes constant, the edge of the copper foil can be exactly determined.

In the case of exposure of a TAB strip with different pitches between the perforation holes PH, the inclination of the optical detector 4 can be changed, as was described above. In this way, the length of the sensor light in the transport direction of the TAB strip can be changed.

Figure 5A:
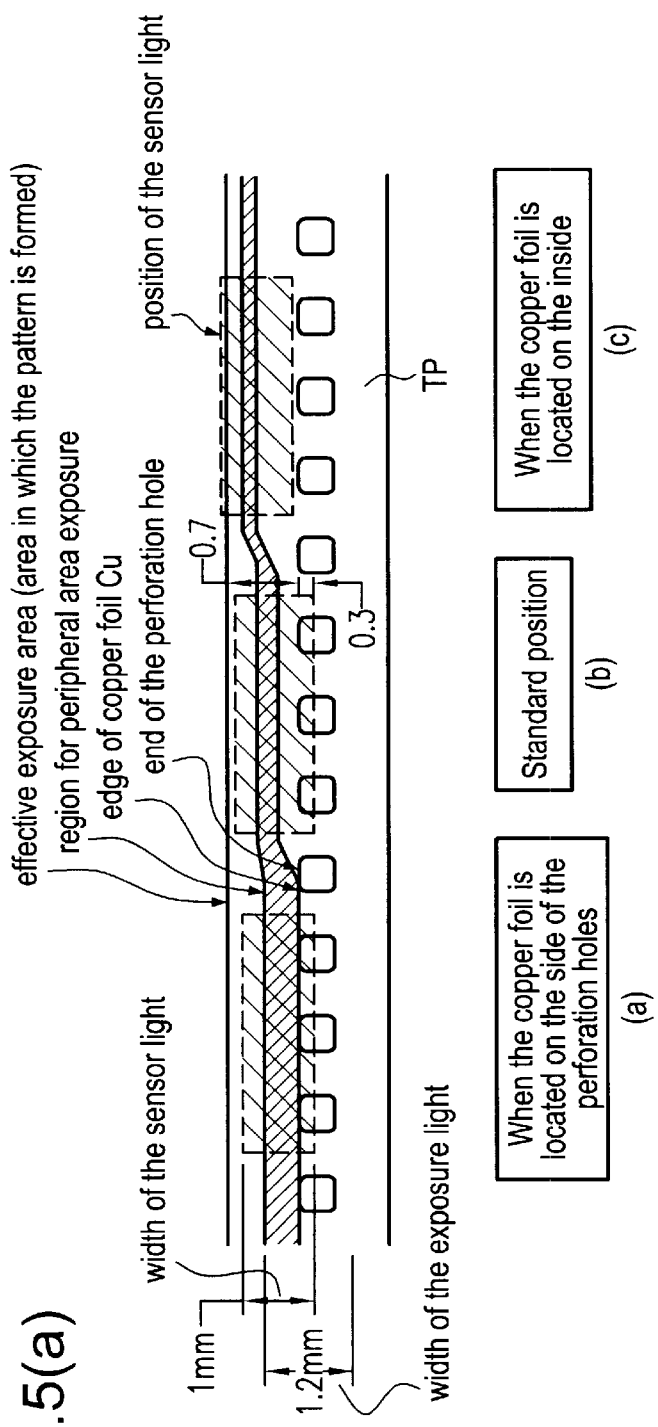
FIGS. 5 (a) & (b) each show a schematic of the region which is subjected to peripheral area exposure of the copper foil.
Figure 5B:
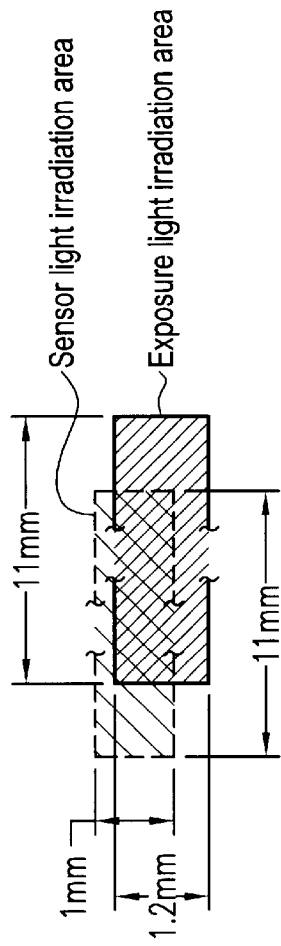

FIGS. 5(*a*) & 5(*b*) schematically show the area which is subject to peripheral area exposure for snaking of the copper foil. The area crosshatched downward toward the right is the area which is subjected to peripheral area exposure (exposure area). The area crosshatched downward toward the left is the area irradiated with the sensor light. In the drawings, the lower side designates the end of the TAB strip TP.

FIG. 5(*b*) shows the positional relationship between the sensor light irradiation area and the irradiation area which is irradiated with the exposure light emitted by the projection lens unit 2, as shown in FIG. 5(*a*). As is shown in FIG. 5(*b*), the length of the sensor light irradiation area and of the exposure light irradiation area in the transport direction of the TAB strip is for example 11 mm. The length (width) in the direction which orthogonally intersects the TAB strip transport direction is, for example, 1 mm for the sensor light irradiation area and is, for example, 1.2 mm in the exposure light irradiation area. As is shown in the drawing, the sensor light irradiation area is located on the side of the TP strip turned somewhat more to the inside than the exposure light irradiation area.

Zone (b) of FIG. 5(*a*) shows a case in which the edge of the copper foil is at the standard position (construction position) at 0.3 mm from the perforation holes PH. Here, the exposure width in the peripheral area of the copper foil is 0.3 mm.

Zone (c) FIG. 5(*a*) shows a case in which the copper foil has meandered towards the inside of the strip TP. In this case, the sensor light no longer passes through the perforation holes PH. The light receiving part 4*b* does not directly receive the sensor light from the projection part 4*a*, by which the amount of light reception is reduced.

To keep the amount of light reception constant, the optical detector 4 is therefore moved onto the outside of the strip TP, by which the exposure width is 0.24 mm, therefore somewhat smaller than in zone (b) of FIG. 5(*a*). Therefore, the necessary exposure width can be ensured. Furthermore, the area in which the pattern is formed is prevented from being exposed.

Zone (a) of FIG. 5(*a*) shows a case in which the copper foil has meandered towards the outside of the strip TP. In this case, the sensor light which passes through the perforation holes PH is increased. In order to keep the amount of light reception constant, the optical detector 4 is moved onto the inside of the strip TP, by which the exposure width becomes somewhat greater than in zone (b) of FIG. 5(*a*). However, because the distance to the area in which the pattern is formed becomes greater, the area for pattern formation is prevented from being exposed.

Since, in this embodiment, the length of the sensor light in the transport direction of the TAB strip is determined by the "pitch between the perforation holes PH multiplied by a natural number", as was described above, the total amount of light received by the light receiving element (the light which has passed through the perforation holes and the light transmitted by the film) does not change, even when the perforation holes move according to the transport of the film circuit board. Therefore, the edge position of the copper foil Cu on the TAB strip TP can be exposed with high precision according to the peripheral area of the TAB strip TP by controlling the position of the projection lens unit 2 regardless of the meandering of the copper foil with respect to the TAB strip and regardless of the snaking of the TAB strip itself, such that the total amount of light received by the light receiving part 4*b* of the optical detector 4 becomes constant.

Furthermore, by changing the inclination of the optical detector 4, the length of the sensor light in the transport direction of the TAB strip can be changed. Therefore, the peripheral area of the TAB strips TP with different pitches between the perforation holes PH can also be easily exposed.

In this embodiment, the width of the sensor light and the positional relationship between the sensor light and the edge of the copper foil were set such that the sensor light, in the cases shown in zones (a) and (b) of FIG. 5(a), passes through some of the perforation holes and that the sensor light in the case shown in FIG. 5(c) does not pass through the perforation holes. However, the invention is not limited thereto, but in each of the cases in zones (a) to (c) of FIG. 5(a), the width of the sensor light and the positional relationship between the sensor light and the edge of the copper foil can also be adjusted such that the sensor light passes through the entire surface of the perforation holes. In all cases in FIG. 5(a), the sensor light need simply be prevented from emerging beyond the edge of the film strip.

FIG. 6 shows the arrangement of a second embodiment of a device in accordance with the invention for exposing a peripheral area. In this embodiment, the projection lens unit is not moved, but by moving a mask, the exposure light irradiation area is moved in the direction which orthogonally intersects the TAB strip transport direction in the plane of transport.

Figure 6A:
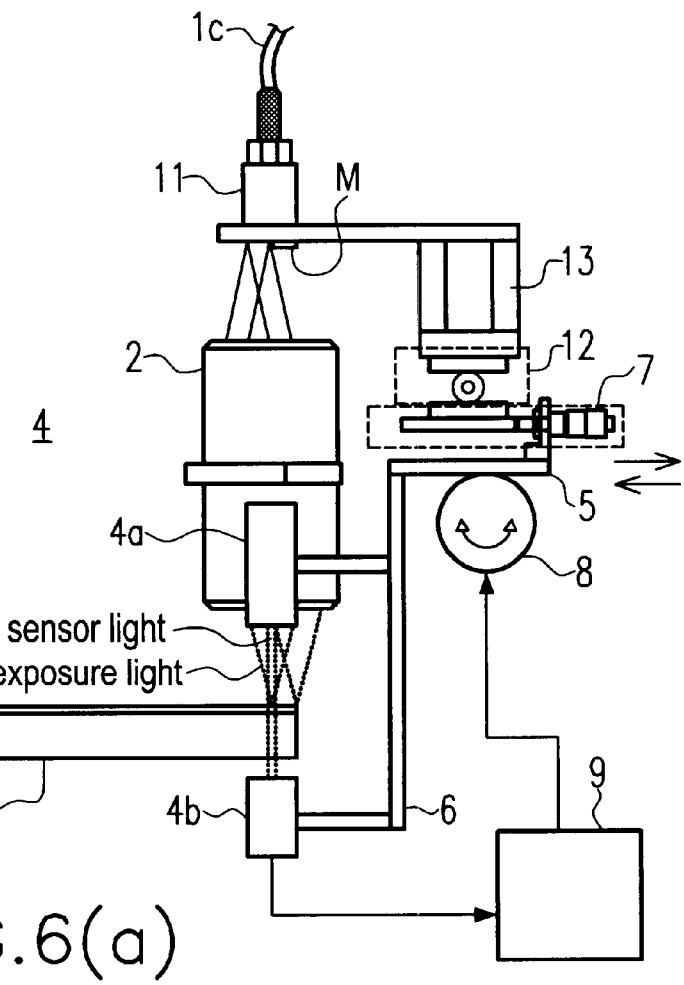
FIGS. 6 (a) & 6(b) each show a schematic of the arrangement of a device for exposing the peripheral area according to a second embodiment of the invention, FIG. 6(b) being an enlarged view of the peripheral area of the copper foil being exposed.

In FIG. 6(a), the device for exposing the peripheral area according to this embodiment is viewed from the transport direction of the TAB strip (according to FIG. 2). Here, the same parts as in FIG. 2 are provided with the same reference numbers for ease of comparison.

In the figure, the exposure light for exposing the resist R on the TAB strip TP (UV radiation) from a light source (which is not shown in this figure of the drawings; but, see FIG. 1) is sent by the quartz optical fiber 1c to a light exit part 11. In the light exit part 11 is the mask M by which some of the exposure light emerging from the light exit part 11 is shielded. The light emerging from the light exit part 11 is incident in the projection lens 2. The projection lens unit 2 focuses the UV radiation onto the peripheral area of the copper foil of the TAB strip TP on the carrier 3. The projection lens unit 2 is attached and is not moved.

Figure 6B:
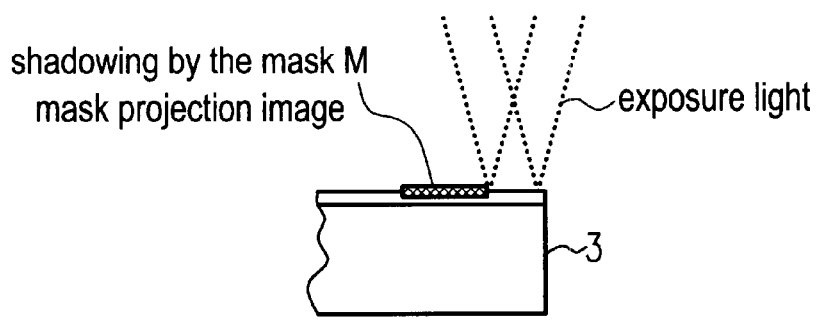

In this embodiment, the exposure light irradiation area is formed by the mask M located in the light exit part 11 and is projected by the projection lens unit 2 onto the TAB strip TP. On the TAB strip TP, therefore, as shown in FIG. 6(b), an inverse image of the mask image is projected and forms the above described irradiation area.

Therefore, in this embodiment, an arrangement is formed in which the part of the exposure light irradiation area shielded by the mask M moves in the direction opposite the direction in which the optical detector 4 is moving. Thus, in this embodiment, in addition to the above described device 7 for adjusting the relative positions, there is a rack and pinion device 12 which is described below.

The location of the edge of the copper foil which has been cemented to the TAB strip TP in the first embodiment is determined by the optical detector 4 which is comprised of the projection part 4a and the light receiving part 4b. For example, the above described parallel light linear sensor can be used as the optical detector 4.

The length of the sensor light with respect to the strip transport direction is determined in the above described first embodiment by the "pitch between the perforation holes PH of the TAB strip TP multiplied by a natural number".

When the position of the edge of the copper foil does not change in the direction which orthogonally intersects the transport direction of the TAB strip TP (to the right and left in FIG. 6), therefore the total amount of the light received by the light receiving part 4b becomes constant even if during transport of the TAB strip, and the sensor light passes through the perforation holes PH, as in the first embodiment. If the position of the optical detector 4 is controlled such that the total amount of light received by the light receiving part 4b becomes constant, the edge position of the copper foil can be determined exactly.

The projection part 4a and the light receiving part 4b of the optical detector 4 are installed in the component 6 for installing the optical detector. Component 6 is installed in the sliding base 5 which is driven by the drive motor 8 in the direction of the arrow in the drawing (in the direction which orthogonally intersects the transport direction of the TAB strip TP in the plane of transport). On the sliding base 5 are the device 7 for adjusting the relative positions and the rack and pinion device 12, via which the light exit part/mask holding base 13 which holds the above described light exit part 11 is installed.

The device 7 for adjusting the relative positions, as was described above, is a device which adjusts the relative positions between the sensor light irradiation area and the exposure light irradiation area. It has a micrometer 7a. By adjusting the micrometer 7a, the relative positions between the position which is irradiated with the exposure light and which is emitted from the light exit part 11 via the projection lens unit 2 onto the TAB strip TP, and the sensor light which is emitted by the projection part 4a of the optical detector 4, can be adjusted.

Figure 7:
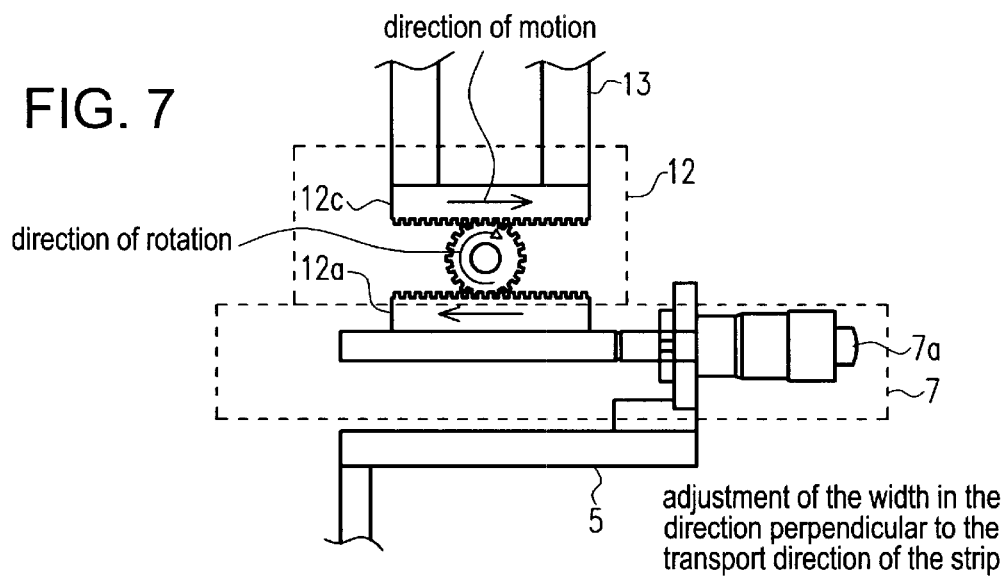
FIG. 7 is a schematic showing of the operation of a rack and pinion device.
Figure 8A:
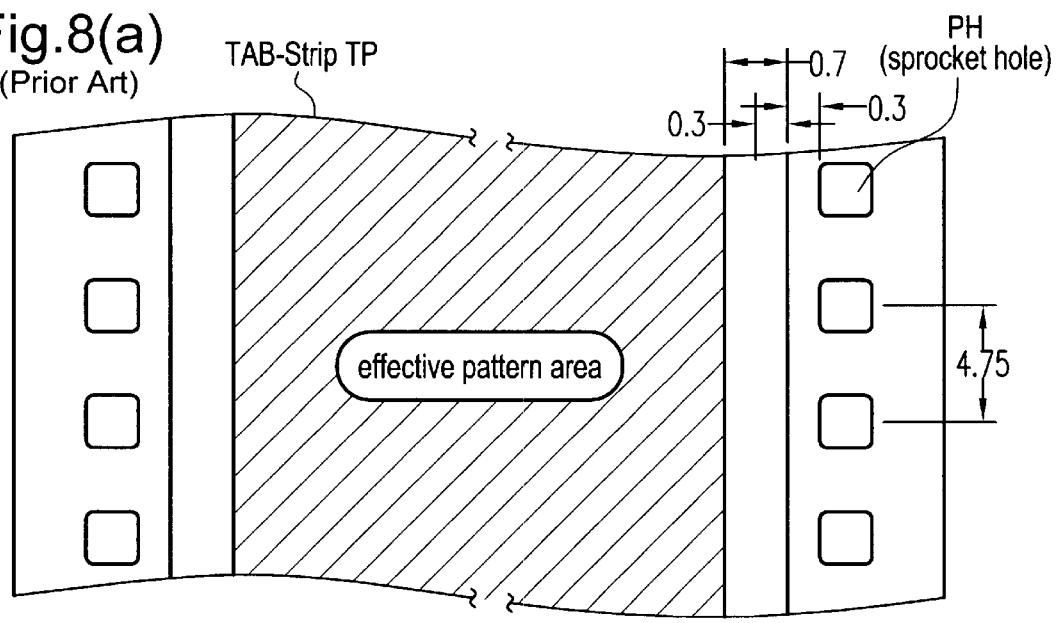
FIG. 8(a) is a schematic depiction of the state in which a resist has been deposited to part of the TAB strip as one of the film circuit boards according to the prior art.
Figure 8B:
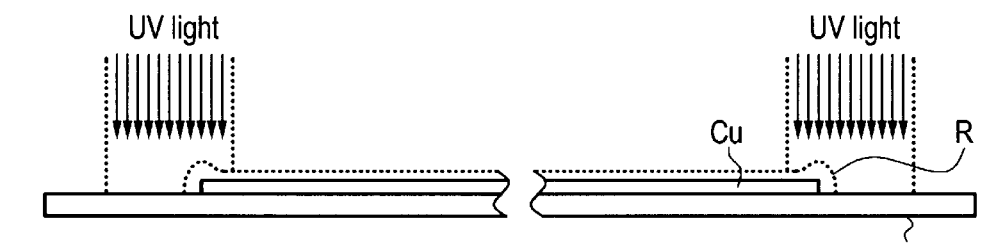
FIG. 8(b) is a schematic depiction of the state in which a resist has been deposited to the copper foil of the TAB strip as one of the film circuit boards according to the prior art.
Figure 9:
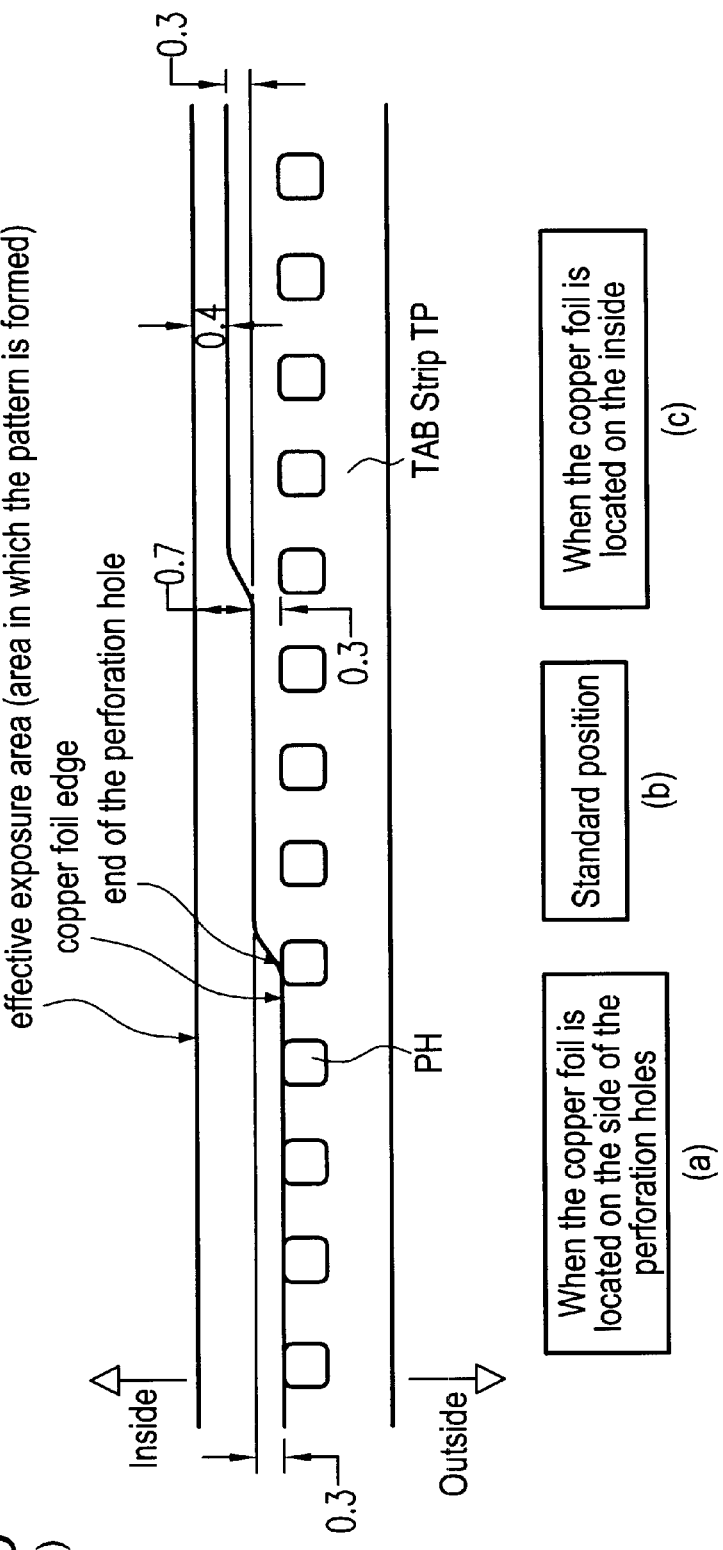
FIG. 9 is a schematic showing of the snaking of the copper foil on a film circuit board according to the prior art.

The rack and pinion device 12, as shown in FIG. 7, has a lower rack 12a which is installed in the sliding base 5, an upper rack 12c which is installed in the light exit part/mask holding base 13 and a pinion 12b between them. The axis of rotation of the pinion 12b is fixed and does not move. When the lower rack 12a moves, for example, to the left in the drawing, the pinion 12b turns, by which the rack 12c is moved to the right.

When the sliding base 5 moves, the light exit part/mask holding base 13 therefore moves by the same amount in the direction opposite the direction in which the sliding base 5 moves. When the optical detector 4 moves, the light exit end 11 moves by the same amount as this motion in the opposite direction. The exposure light irradiation part shielded by the mask M moves in the same direction as the direction of motion of the optical detector 4 by the same amount.

A signal with a magnitude which corresponds to the intensity of the light received by the light receiving part 4b of the optical detector 4 (amount of light reception) is input into the control element 9. The control element 9 drives the drive motor 8, and thus, moves the sliding base 5 and the optical detector 4 such that the above described amount of light reception becomes always constant, as was described above. Since the light exit end 11 is installed into the sliding base 5 via the device 7 for adjusting the relative positions and via the rack and pinion device 12, when the sliding base 5 moves, the area irradiated with the exposure light which is emitted by the above described light exit part 11 moves in the same direction and by the same amount as the sliding base 5. This means that the optical detector 4 moves such that the amount of light reception becomes always constant. The light exit part 11 moves in the direction opposite the direction in which the sensor light is moving. The exposure light irradiation area moves in the same direction as the direction in which the sensor light is moving and by the same amount as the sensor light.

As was described above, in this embodiment, the positions of the light exit part 11 and the mask M are controlled such that the total amount of light received by the light receiving part 4b of the optical detector 4 becomes constant, as in the first embodiment. In this way, the edge position of the copper foil on the TAB strip TP can be exposed with high precision according to the peripheral area of the TAB strip TP.

Furthermore, by changing the inclination of the optical detector 4, the length of the sensor light in the transport direction of the TAB strip can be changed. Therefore, the peripheral area of the TAB strips TP with different pitches between the perforation holes PH can be easily exposed.

Furthermore, in this embodiment, the mask M is provided in the light exit part 11, and thus moves when the light exit part 11 is moved. Therefore, it is possible to prevent the means for controlling the motion of the sliding base 5 from becoming large and heavy even if the projection lens unit 2 becomes large when exposure accuracy is required.

ACTION OF THE INVENTION

As was described above, according to the invention, in an exposure device which exposes a resist which has been deposited to the peripheral area of a conductive foil which has been cemented on a film circuit board, the location of the edge of the conductive foil is determined and the following is done:

an optical detector which has a projection part and a light receiving part is used as the sensor for determining the edge of the conductive foil; and the length of the sensor light emitted by the projection part onto the strip in the transport direction of the film circuit board is determined by the "pitch between the perforation holes multiplied by a natural number".

This measure makes it possible to prevent the intensity of the light received by the light receiving part of the optical detector from fluctuating greatly even if the position of the perforation holes in the transport direction is changed by the transport of the film circuit board.

Therefore, by position control of the exposure light irradiation area, such that the total amount of sensor light received by the light receiving part becomes constant, according to the edge position of the conductive foil, the resist can be accurately exposed in the peripheral area of the conductive foil.

What is claimed is:

1. Device for exposing resist on a peripheral area of a film circuit board, comprising:

a means for transporting a film circuit board having perforation holes with a stipulated pitch relative to one another, in a certain transport direction;

a means for irradiating resist on a peripheral area of a conductive foil located on the film circuit board with exposure light from a light irradiation means which has a stipulated irradiation area;

a means for edge determination which comprises an optical detector for receiving sensor light from a projection part;

a means for motion control which, during transporting of the film circuit board, subjects said means for edge determination to an amount of controlled movement in a direction which essentially orthogonally intersects said transport direction in a plane of transport; and a device for moving the area irradiated with the exposure light in the same direction as the direction of controlled movement of the edge determination means and by the same amount as the amount of controlled movement of the edge determination means;

wherein the projection part of the optical detector is arranged to project sensor light onto the film circuit board with a length in the transport direction of the film circuit board which is determined by said pitch of perforation multiplied by a natural number;

wherein the light receiving part is arranged to receive the sensor light emitted onto the edge part of the conductive foil; and wherein said motion control means is adapted for subjecting the edge determination means to motion control in a manner causing the amount of light received by the light receiving part to be constant.

2. Device for exposing resist on a peripheral area of a film circuit board according to claim 1, wherein the projection part is arranged to direct sensor light to the optical detector at an adjustable inclination relative to said transport direction for changing the length of the sensor light projected onto the film circuit board in the transport direction.

3. Device for exposing resist on a peripheral area of a film circuit board according to claim 1, wherein the device for moving the area irradiated with the exposure light comprises a movable mask; and wherein said motion control means comprises means for moving said movable mask and said edge determination means in opposite directions.

* * * * *